(12) United States Patent
Kamimoto

(10) Patent No.: US 11,309,705 B2
(45) Date of Patent: Apr. 19, 2022

(54) SEMICONDUCTOR DEVICE

(71) Applicant: RENESAS ELECTRONICS CORPORATION, Tokyo (JP)

(72) Inventor: Akio Kamimoto, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 17/004,704

(22) Filed: Aug. 27, 2020

(65) Prior Publication Data

US 2021/0111553 A1 Apr. 15, 2021

(30) Foreign Application Priority Data

Oct. 9, 2019 (JP) .............................. JP2019-185965

(51) Int. Cl.
| | |
|---|---|
| *H02H 7/00* | (2006.01) |
| *H02H 7/18* | (2006.01) |
| *H03F 3/45* | (2006.01) |
| *H03K 5/24* | (2006.01) |
| *H02H 1/00* | (2006.01) |

(52) U.S. Cl.
CPC ............ *H02H 7/18* (2013.01); *H02H 1/0007* (2013.01); *H03F 3/45475* (2013.01); *H03K 5/24* (2013.01)

(58) Field of Classification Search
None
See application file for complete search history.

(56) References Cited

U.S. PATENT DOCUMENTS 9,281,746 B1 * 3/2016 Apostolescu ....... H02M 3/1588

FOREIGN PATENT DOCUMENTS

| JP | 2019-054384 A | 4/2019 | |
|---|---|---|---|
| WO | WO-2014064142 A1 * | 5/2014 | ........... H02H 11/003 |

* cited by examiner

*Primary Examiner* — Stephen W Jackson
(74) *Attorney, Agent, or Firm* — McDermott Will & Emery LLP

(57) ABSTRACT

A semiconductor device includes a bridge circuit comprising first to fourth elements, a first diagnostic circuit that detects a potential difference between two intermediate nodes of the bridge circuit and a control circuit that detects a failure of the first or second element based on an output of the first diagnostic circuit, wherein the first and second elements are first and second power transistors connected in series.

15 Claims, 9 Drawing Sheets

FIG. 5

| Status | Tr-11 | Tr-12 | VN1, 2 | DOUT1 | DOUT2 |
|---|---|---|---|---|---|
| Normal | Normal | Normal | VN1≃VN2 | Normal | Normal |
| Fault 1 | Short | Normal | VN1>VN2 | Fault | Normal |
| | Normal | High on-resistance | VN1>VN2 | Fault | Normal |
| Fault 2 | Normal | Short | VN1<VN2 | Normal | Fault |
| | High on-resistance | Normal | VN1<VN2 | Normal | Fault |

SEMICONDUCTOR DEVICE

CROSS-REFERENCE TO RELATED APPLICATIONS

The disclosure of Japanese Patent Application No. 2019-185965 filed on Oct. 9, 2019 including the specification, drawings and abstract is incorporated herein by reference in its entirety.

BACKGROUND

The present invention relates to a semiconductor device and, in particular, to a semiconductor device with inverse connection protection for a power supply, such as a battery. The background of the invention.

IPD (Intelligent Power Device) is used to drive a load such as automobile motor and LEs (Light Emitting Diode). In addition, a semi-conductor relay device is used to power the load.

In IPD and semiconductor-relay device that use a battery as a power source, if the positive and negative electrodes of the battery are reversely connected, this can lead to device destruction. Therefore, a circuit for battery reverse connection protection is provided.

Patent Document 1 discloses a solid-state relay device with reverse connection protection circuit. Specifically, two power transistors (QH1, QH2) are connected in series between the power supply line to which the battery is connected (VD1$p$ of FIG. 3) and the load (LD). Further, the body diode Dh1 is connected the power transistor QH1, the body diode Dh2 is connected to the power transistor QH2. Here, the power transistor QH1 and the body diode Dh1 is installed with the aim of interrupting the reverse current when the battery is connected with the opposite polarity.

Patent Document 1 further discloses fault diagnostic technique for a power transistor QH1, QH2. Specifically, first, with the power transistor QH1, QH2 both turned off, applying a diagnostic potential Vxh to the connecting point of the two power transistors (node Nx). Then, by measuring the change in the potential of the node Nx, it detects the presence or absence of a short-circuit failure of the power transistor QH1, QH2.

PRIOR-ART DOCUMENT

Patent Document

[Patent Document 1] Japanese Unexamined Patent Application Publication No. 2019-54384

SUMMARY

However, the art disclosed in Patent Document 1, the power transistor must be turned off when diagnosing a failure. Therefore, is difficult to detect a fault with the power transistor turned on. In particular, it is difficult to quickly detect a failure that occurs when the power transistor turns on (transition period from off to on) or when turning off (transition period from on to off).

Other objects and novel features will become apparent from the description of the specification and drawings.

Means of Solving the Problems

A semiconductor device according to an embodiment includes a bridge circuit comprising first to fourth elements, a first diagnostic circuit that detects a potential difference between two intermediate nodes of the bridge circuit and a control circuit that detects a failure of the first or second element based on an output of the first diagnostic circuit, wherein the first and second elements are first and second power transistors connected in series.

In the semiconductor device according to an embodiment, a failure of a power transistor can be quickly detected.

BRIEF DESCRIPTION OF THE DRAWINGS

FIG. 5 is a diagram showing the relationship between the failure of semiconductor device, the voltage value, and the output value according to second embodiment.

DETAILED DESCRIPTION

Figure 1:
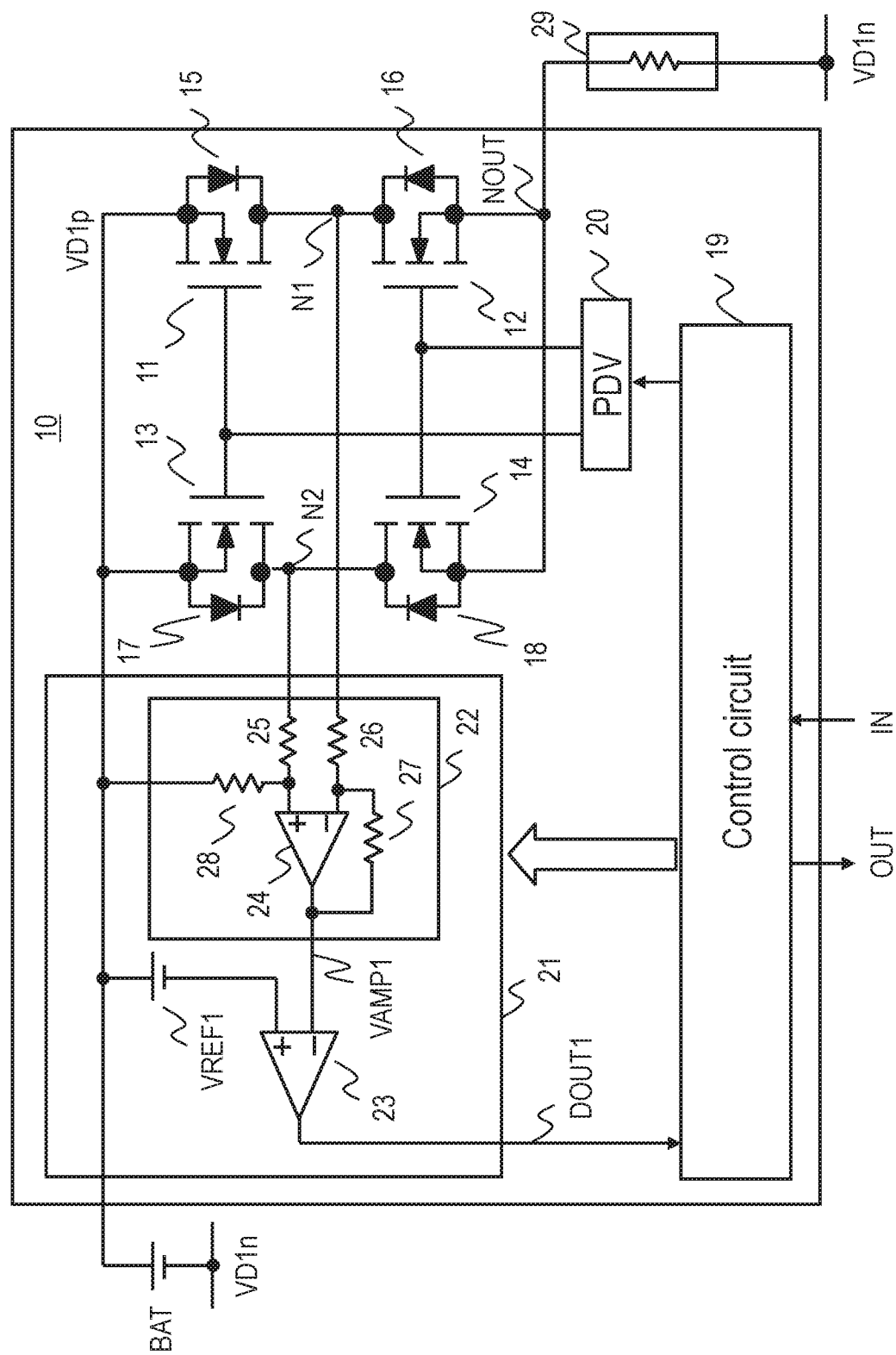
FIG. 1 is a schematic diagram of a semiconductor device according to first embodiment.

Hereinafter, a semiconductor device according to an embodiment will be described in detail by referring to the drawings. In the specification and the drawings, the same or corresponding form elements are denoted by the same reference numerals, and a repetitive description thereof is omitted. In the drawings, for convenience of description, the configuration may be omitted or simplified. Also, at least some of the embodiments may be arbitrarily combined with each other.

First Embodiment

FIG. 1 is a block diagram showing a configuration of a semiconductor device 10 according to first embodiment.

As shown in FIG. 1, semiconductor device 10 is a semiconductor device (also referred to as a semi-conductor relay device) that provides power from the battery BAT to the load 29. Semiconductor device 10 includes power transistors 11 and 12, sense MOS transistors (hereinafter, also referred to as sense transistor or sense MOS) 13 and 14, a control circuit 19, a pre-driver (PDV) 20, and a diagnostic circuit (first diagnostic circuit) 21.

Each of the power transistors 11, 12 and the sense MOS 13, 14 have body diodes 15, 17, 18. The anode of the body diode 15 is connected to the source of the power transistor 11, and the cathode is connected to the drain. The same applies to the body diodes 16, 17 and 18. Here, the power transistor 11, the body diode 15, the sense MOS 13, and the body diode 17, when the battery BAT is connected with the opposite polarity, are intended to cut off the reverse current.

The source of the power transistor 11 and the source of the sense MOS 17 are connected to the power line to which battery BAT is connected. The drain of the power transistor 11 is connected to the drain of the power transistor 12. The drain of the sense MOS 13 is connected to the drain of the sense MOS 14. The source of the power transistor 12 and the source of the sense MOS 14 are connected to the output-node NOUT. The load 29 is connected to the output nodes NOUT.

Sense MOS 13, 14 are for diverting a portion of the current flowing through the power transistors 11 and 12. In this first embodiment, the current sense ratio of the power transistor 11 and the sense MOS 13 is the same as the current sense ratio of the power transistor 12 and the sense MOS 14. Here, the current sense ratio is the ratio of the current flowing through the power transistor and the current flowing through the sense MOS. The current sense ratio can also be expressed as the ratio of the number of elements constituting the power transistor and the number of elements constituting the sense MOS. With such a configuration, the power transistors 11 and 12 and the sense MOS 13, 14 comprises a bridge circuit (the power transistor 11 as a first element, the power transistor 12 as a second element, the sense MOS 13 as a third element, the sense MOS 14 as a fourth element, the bridge circuit is constituted by the first to fourth elements).

In FIG. 1, the power transistors 11 and 12, the sense MOS 13, 14 are NMOS transistors, but are not limited thereto. They may be IGBTs (Insulated Gate Bipolar Transistor).

The pre-driver 20 generates a gate signal of the power transistors 11 and 12, the sense MOS 13, and 14 based on an instruction from the control circuit 19. Gate of the power transistor 11 and the gate of the sense MOS 13 are controlled by a common gate signal (first gate signal). The gate of the power transistor 12 and the gate of the sense MOS 14 are also controlled by a common gate signal (second gate signal). Pre-driver 20, for generating the first and second gate signals, has a boosting circuit such as a charge pump (not shown).

Control circuit 19, based on an instruction from an external circuit such as a CPU or a timer, controls the power transistors 11, 12 and the sense MOS 13, 14 via the pre-driver 20. More specifically, when supplying power to the load 29, the control circuit 19 controls so that the power transistors 11 and 12, the sense MOS 13, 14 are turned on. When stopping the power supply to the load 29, the control circuit 19 performs control so that the power transistors 11, 12 and the sense MOS 13, 14 are turned off. When the battery BAT is connected in the opposite polarity, the control circuit 19 performs control so that the power transistors 11, 12 and the sense MOS 13, 14 are turned off. Further, if the diagnostic circuit 21 detects a failure, the control circuit 19 performs control so that the power transistors 11, 12 and the sense MOS 13, 14 are turned off, and outputs the diagnostic result to the outside such as CPU. The diagnostic circuit 21 will be described later.

Diagnostic circuit 21 is a circuit for fault diagnosis of the power transistors 11, 12 and sense MOS 13, 14. Diagnostic circuit 21, based on an instruction from the control circuit 19, performs a failure diagnosis, and outputs the failure diagnosis result to the control circuit 19.

Diagnostic circuit 21 has a differential amplifier circuit (first differential amplifier circuit) 22 and the voltage determination circuit (first voltage determination circuit) 23, reference voltage circuit VREF1. The differential amplifier circuit 22 has an operational amplifier (first operational amplifier) 24, resistors 25-28. The non-inverting input of the operational amplifier 24 is connected to one ends of the resistor 25 and the resistor (first resistor) 28. The other end of the resistor 25 is connected to a connecting node N2 (second intermediate node) of the sense MOS 13 and the sense MOS 14. The other end of the resistor 28 is connected to a power line. The inverting input of the operational amplifier 24 is connected to one end of the resistor 25. The other end of the resistor 25 is connected to a connection node N1 (first intermediate node) of the power transistor 11 and the power transistor 12. The output and the inverting input of the operational amplifier 24 is connected to a resistor (feedback resistor, second resistor) 27.

Voltage determination circuit 23 is constituted by a comparator (first comparator). The non-inverting input of the voltage determination circuit 23 is connected to the power line via reference voltage circuit (first reference voltage circuit) VREF1. The inverting input of the voltage determination circuit 23 is connected to the output of the differential amplifier circuit 22 (output of the operational amplifier 24). Output DOUT1 of the voltage determination circuit 23 is output to the control circuit 19.

Figure 2:
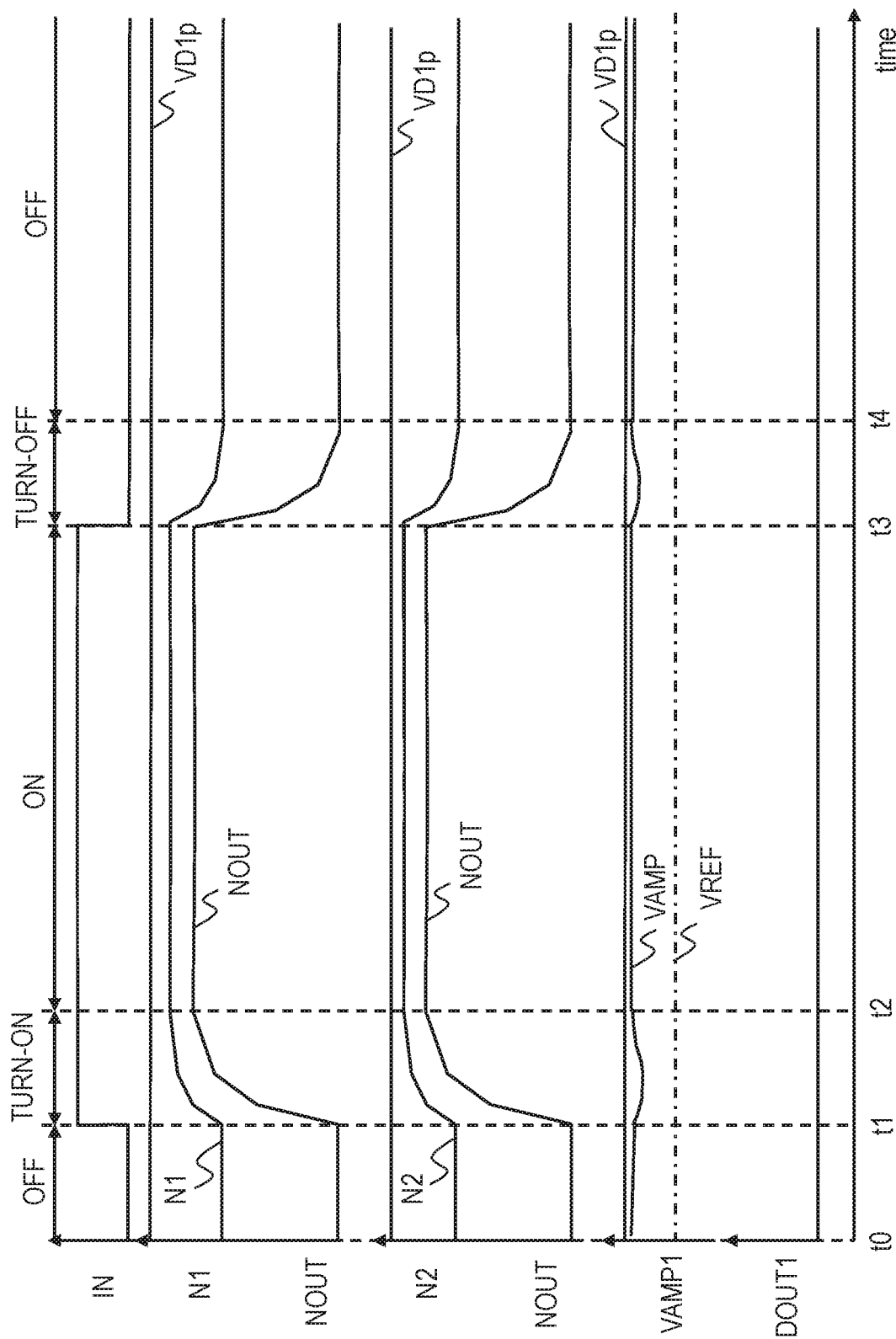
FIG. 2 is a timing chart showing the operation of semiconductor device in accordance with first embodiment.
Figure 3:
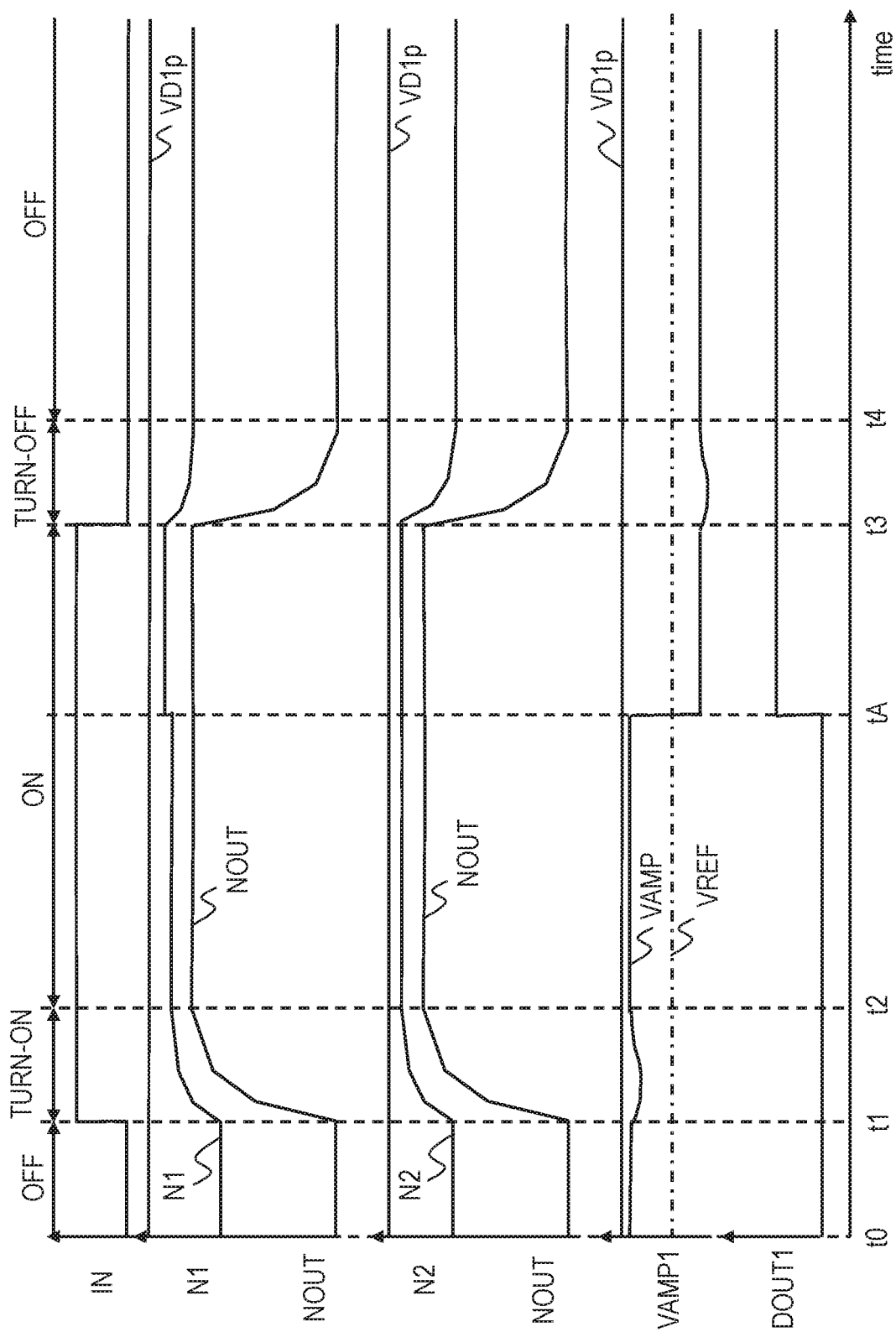
FIG. 3 is a timing chart showing the operation of semiconductor device in accordance with first embodiment.

Next, the operation of semiconductor device 10 according to present embodiment 1 will be described. FIG. 2 is a timing chart showing normal operation of semiconductor device 10. Further, FIG. 3 is a timing chart showing an operation when a failure occurs in semiconductor device 10.

First, the normal operation of semiconductor device 10 will be described with reference to FIG. 2. Semiconductor device 10, in accordance with an instruction from an external circuit such as a CPU or a timer, controls the power supplied to the load 29. Specifically, based on the IN signal input to the control circuit 19, control circuit 19 turns on or off the power transistors 11 and 12, the sense MOS 13, 14 via the pre-driver 20. In FIG. 2, time t0-t1 is off period, t1-t2 is turn on period, t2-t3 is on period, t3-t4 is turn off period, t4 and after t4 is off period.

First, at time t1, the IN signal becomes high level from low level. Control circuit 19, via the pre-driver 20, makes the gate signal of the power transistor 11 and the sense MOS 13 (first gate signal) and the gate signal of the power transistor 12 and the sense MOS 14 (second gate signal) to a high level. Consequently, the power transistors 11 and 12, the sense MOS 13, 14 are turned on, a current flows through the load 29. The ratio of the current flowing through the power transistors 11 and 12 and the current flowing through the sense MOS 13, 14 are determined by the current sense ratio. For example, if the current sense ratio n:1 (n is a real number of 1 or more), a current flowing the sense MOS 13, 14 is 1/n of a current flowing the power transistors 11 and 12. When a current flows through the power transistors 11, 12 and the sense MOS 13, 14, a voltage is generated at the nodes N1, N2, and NOUT. These voltages are determined by the on-resistance of the power transistors 11, 12, sense MOS 13, 14.

As shown in FIG. 2, at time t1 to t2, the voltages of the nodes N1, N2, NOUT are gradually increased, the voltages of the nodes N1, N2, NOUT at time t2 to t3 become a predetermined voltage.

Here, as described above, the current sense ratio of the power transistor 11 and the sense MOS 13 is same as the current sense ratio of the power transistor 12 and the sense MOS 14. Thus, the power transistors 11 and 12, sense MOS13, 14 constitute a bridge circuit. Nodes N1 and N2 are midpoints of the bridge circuit. Thus, the nodes N1 and N2 are at approximately the same voltages if there are no faults in the power transistors 11, 12, sense MOS 13, 14, and body diodes 15-18.

Differential amplifier circuit 22 amplifies the potential difference between the nodes N1 and N2, and outputs the amplified voltage VAMP1 to the voltage determination circuit 23. Assuming that each resistance value of the resistors 25 and 26 is R1, each resistance value of the resistors 27 and 28 is R2, the voltage of the node N1 is VN1, the voltage of the node N2 is VN2, and the voltage of the power line to which the battery BAT is connected is VD1$p$, VAMP1=(VN2−VN1)*R2/R1+VD1$p$. VAMP1 varies with the difference between VN2 and VN1 on VD1$p$ basis. If there are no failures in the power transistors 11, 12, sense MOS 13, 14, and body diodes 15-18, the voltage VAMP1 becomes 0 on VD1$p$ basis, since the nodes N1 and N2 become approximately the same voltage.

When the output voltage of reference voltage circuit VREF1 is VREF1, the voltage determination circuit 23 compares the voltage VAMP1 with (VD1$p$−VREF1). Here, the (VD1$p$−VREF1) is set to be lower than VAMP1 if there is no failure in the power transistors 11 and 12, the sense MOS 13, 14, and the body diodes to 18. Therefore, the output DOUT1 of the voltage determination circuit 23 becomes a low level.

Next, at time t3, the IN signal changes from the high level to the low level. Control circuit 19, via the pre-driver, makes the gate signal of the power transistor 11 and the sense MOS 13 (first gate signal) and the gate signal of the power transistor 12 and the sense MOS 14 (second gate signal) to a low level. Consequently, the power transistors 11 and 12, the sense MOS 13, 14 are turned off, the output current to the load 29 is stopped. After time t4, the voltages of the nodes N1, N2, and NOUT become low level.

Even after time t3, the voltages of nodes N1 and N2 will be approximately the same voltage if there are no failures in the power transistors 11 and 12, the sense MOS 13, 14, and the body diodes 15-18. Therefore, the output DOUT1 of the voltage determination circuit 23 is also low level after time t3.

As described above, in a normal state in which there is no failure in the power transistors 11 and 12, the sense MOS 13, 14, and the body diodes 15 to 18, the control circuit 19 constantly receives a low-level diagnostic result DOUT1 from the diagnostic circuit 21. Consequently, the control circuit 19 continues supplying power to the load 29 as the sense MOS 13, 14, and the body diodes 15-18 are in a normal condition.

Next, the operation when a failure occurs in semiconductor device 10 will be described with reference to FIG. 3. Similar to FIG. 2, it is a period in which the times t0 to t1 are off period, t1 to t2 are turned on period, t2 to t3 are on period, t3 to t4 are turned off period, and t4 and thereafter are turned off period. However, at time tA, a failure in the power transistor 11 or 12, a short circuit failure between the source and drain of the power transistor 11 or a failure in which the on-resistance of the power transistor 12 becomes larger than expected as a specific example occurs.

The operation from the time t0 to the time tA is the same as the normal operation of semiconductor device 10, and therefore the explanation thereof is omitted. As described above, the time t0 to tA at which semiconductor device 10 is normal, the output DOUT1 of the diagnostic circuit 21 is low level.

At time tA, if a short circuit fault occurs between the source and drain of the power transistor 11, the voltage at node N1 rises to near VD1$p$ Since the voltage of the node N1 is higher than the voltage of the node N2, the output VAMP1 of the differential amplifier circuit 22 becomes a negative voltage on VD1$p$ basis, a voltage lower than the normal.

Alternatively, at time tA, when a failure that the on-resistance of the power transistor 12 is larger than expected occurs, the voltage of the node N1 is increased than in the normal state. Again, since the voltage of the node N1 is higher than the voltage of the node N2, the output VAMP1 of the differential amplifier circuit 22 is a voltage lower than the normal.

Voltage determination circuit 23 compares VAMP1 with (VD1$p$−VREF1). Here, the (VD1$p$−VREF1) is set to be higher than the voltage of VAMP1 when there is a failure in the power transistors 11 and 12. Therefore, the output DOUT1 of the voltage determination circuit 23 becomes high level at time tA.

Control circuit 19, at time tA, receives the diagnostic result indicating a failure from the diagnostic circuit 21 (high-level DOUT1). As a result, the control circuit 19 set the power transistor 11 and 12 to the off state by setting the second gate signal to a low level and notifies the failure state to an external circuit such as a CPU (OUT signal).

In FIG. 3, the time tA at which a failure occurs has been described as the on period (t2 to t3), but the same applies to the turn-on and turn-off periods. For example, during the turn-on period, if a short circuit fault occurs between the source and drain of the power transistor 11, the voltage of the node N2 is gradually increased as shown in FIG. 3. On the other hand, the voltage at node N1 rises close to VD1$p$ and becomes higher than the voltage at node N2. Therefore, even in this instance, the diagnostic circuit 21 outputs a high-level DOUT1 as a diagnostic result.

In addition, semiconductor device 10 is in a normal state when DOUT1 is low level, semiconductor device 10 when DOUT1 is high level has been described as a fault state, but not limited thereto. With the configuration of the voltage determination circuit 23, semiconductor device 10 may be in a normal state when DOUT1 is at a high level, and semiconductor device 10 may be in a fault state when DOUT1 is at a low level.

As described above, in semiconductor device 10 according to first embodiment, since the power transistors 11 and 12 are constantly monitored in any of the off, turn-on, on, turn-off, and off states, a failure in operation can be immediately detected. Further, the potential difference between VN1 and VN2 is not affected by the magnitude of the output current to the load 29. Therefore, the failure of semiconductor device 10 can be detected regardless of the magnitude of the output current to the load 29.

Second Embodiment

Figure 4:
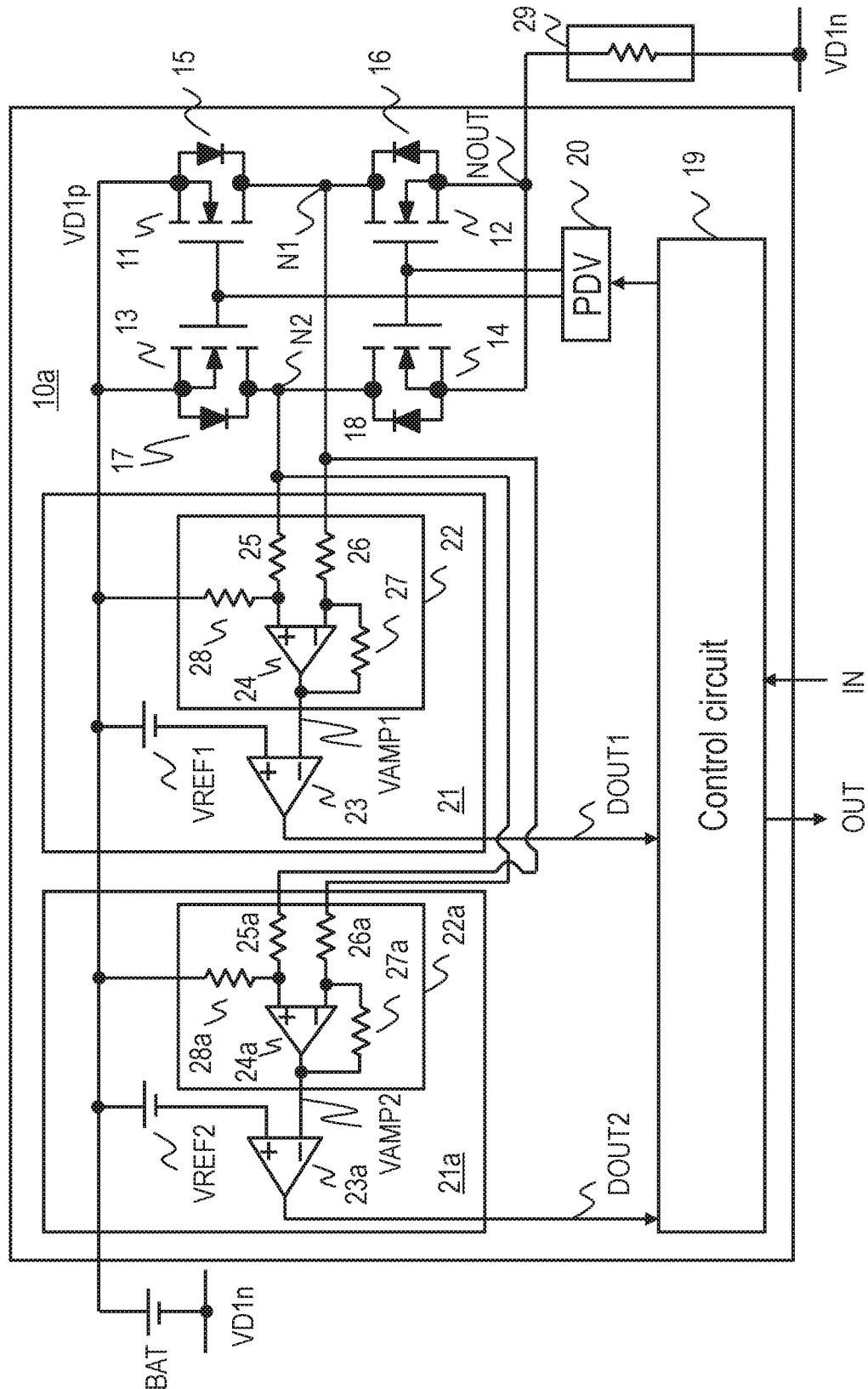
FIG. 4 is a diagram of a semiconductor device according to second embodiment.

FIG. 4 is a block diagram showing a configuration of a semiconductor device 10$a$ according to second embodiment.

The difference from first embodiment is that a diagnostic circuit (second diagnostic circuit) 21$a$ is added. The internal configuration of the diagnostic circuit 21$a$ is the same as that of the diagnostic circuit 21. The difference between the diagnostic circuits 21 and 21$a$ is the connection between the nodes N1 and N2. In the case of the diagnostic circuit 21, the node N1 is connected to the inverting input of the operational amplifier 24, the node N2 is connected to the non-inverting input. In the case of the diagnostic circuit 21$a$, the node N2 is connected to the inverting input of the operational amplifier (second operational amplifier) 24$a$, the node N1 is connected to the non-inverting input. Further, the non-inverting input of the voltage determination circuit (second voltage determination circuit) 23$a$ is connected to the power line via reference voltage circuit (second reference voltage circuit) VREF2. Voltage determination circuit 23$a$ compares the output VAMP2 of the differential amplifier circuit (second differential amplifier circuit) 22$a$ with (VD1$p$−VREF2), and outputs the comparison result as a DOUT2.

Next, the operation of semiconductor device 10a according to second embodiment will be described.

First, the normal operation of semiconductor device 10a will be described. When semiconductor device 10a is normal, the operation is the same as that of first embodiment. That is, if the power transistors 11, 12, sense MOS 13, 14, and body diodes 15-18 are not faulty, the nodes N1 and N2 are at approximately the same voltage. Therefore, the diagnostic circuit 21 outputs a low-level DOUT1 to the control circuit 19.

In the diagnosis circuit 21a, the connection of the nodes N1 and N2 is reversed from that of the diagnosis circuit 21. Therefore, it is VAMP2=(VN1−VN2)*R2/R1+VD1p. It the node N1 and N2 is the same voltage, similarly to the diagnostic circuit 21, VAMP2 becomes 0 with reference to VD1p, the voltage determination circuit 23a outputs a low-level DOUT2.

The control circuit 19 determines a fault condition of semiconductor device 10a from the output DOUT1 of the diagnostic circuit 21 and the output DOUT2 of the diagnostic circuit 21a. If both DOUT1 and DOUT2 are low, semiconductor device 10a is normal and continues to power the load 29.

Next, the operation when a failure occurs in semiconductor device 10a will be described. The following two faults are assumed. The first failure is a short-circuit fault between the source and drain of the power transistor 11, or a fault in which the on-resistance of the power transistor 12 is greater than assumed (same as first embodiment). The second failure is a short circuit fault between the source and drain of the power transistor 12, or a fault in which the on-resistance of the power transistor 11 is greater than assumed.

First, a case where the first failure occurs will be described. Similar to FIG. 3, it is assumed that a short-circuit failure between the source and drain of the power transistor 11 at time tA, or a fault in which the on-resistance of the power transistor 12 is greater than assumed has occurred. In this case, as described in first embodiment, since VN1>VN2, the diagnostic circuit 21 outputs a high-level DOUT1 at time tA. On the other hand, the diagnostic circuit 21a, since VAMP2 is the voltage of 0 with reference to VD1p (saturated in VD1p), DOUT2 becomes low level.

The control circuit 19, since it has received a high-level DOUT1 and a low-level DOUT2, determines that a first failure occurs in semiconductor device 10a, i.e., a short-circuit failure between the source and drain of the power transistor 11, or the on-resistance of the power transistor 12 is greater than the assumed. In this case, the control circuit 19 stops the power supply to the load 29, and notifies the failure state to an external circuit such as a CPU.

Next, the case where the second failure occurs will be described. It is assumed that a short-circuit failure between the source and drain of the power transistor 12 at time tA or a failure in which the on-resistance of the power transistor 11 becomes larger than expected has occurred. In this case, the voltage of the node N1 is lower than normal. Because of VN1<VN2, VAMP1 is at 0 (saturated with VD1p) on VD1p basis. Therefore, the diagnostic circuit 21 outputs a low-level DOUT1.

On the other hand, when VN1<VN2, the voltage VAMP2 becomes negative voltage on VD1p basis. Here, if there is a failure in the power transistors 11 and 12, (VD1p−VREF2) is set to be higher than the voltage of VAMP2. In this case, the output DOUT2 of the voltage determination circuit 23a is a high level.

Since the control circuit 19 receives a low-level DOUT1 and a high-level DOUT2, it determines that a second failure occurs in semiconductor device 10a, i.e., a short-circuit failure between the source and drain of the power transistor 12, or the on-resistance of the power transistor 11 is greater than the assumed. In this case, the control circuit 19 stops the power supply to the load 29, and notifies the failure state to an external circuit such as a CPU.

FIG. 5 summarizes VN1, VN2, DOUT1, DOUT2 relationships for each failure of the power transistors 11 and 12.

As described above, semiconductor device 10a according to second embodiment can detect more faults in addition to the effects of first embodiment.

Third Embodiment

Figure 6:
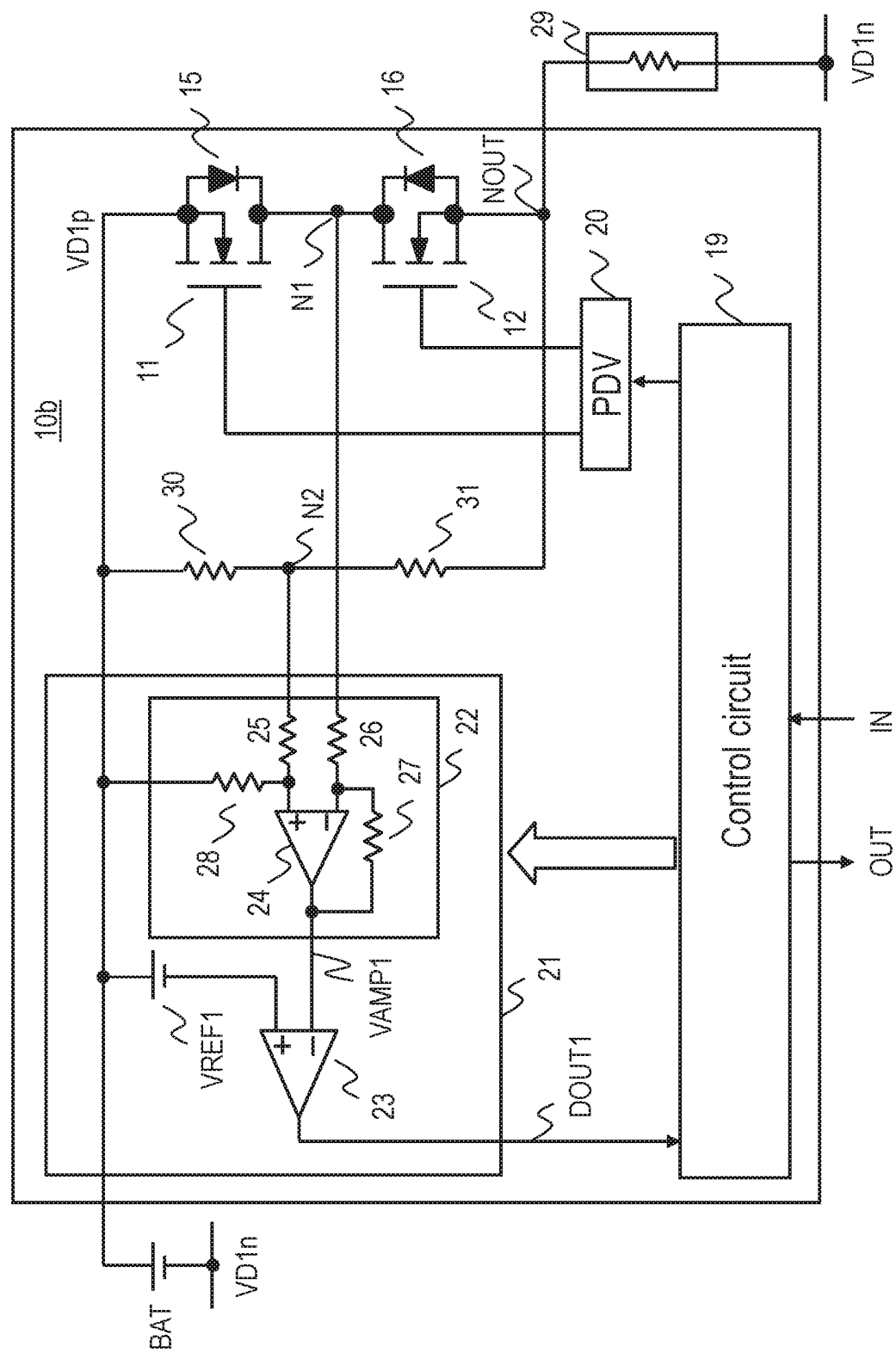
FIG. 6 is a diagram of a semiconductor device according to third embodiment.

FIG. 6 is a block diagram showing a configuration of a semiconductor device 10b according to third embodiment.

The difference from first embodiment is that the sense MOS 13 14 are replaced by the resistors 30 and 31. Like the first embodiment, since a ratio of on-resistances of the power transistors 11, 12 is equal to a ratio of resistances of the resistor 30 (first resistor) and the resistor 31 (second resistor), the power transistors 11, 12 and the resistors 30, comprise a bridge circuit (the power transistor 11 as a first element, the power transistor 12 as a second element, the resistor 30 as a third element, the resistor 31 as a fourth element, the first to fourth elements constitute a bridge circuit).

If semiconductor device 10b is normal, in turned on, on or off period of the power transistors 11, 12, VN1 and VN2 are approximately the same voltage. Therefore, the diagnostic circuit 21 outputs a low-level DOUT1 in the same manner as the diagnostic circuit in first embodiment.

Similar to FIG. 3, in semiconductor device 10b, if a short-circuit failure occurs between the source and drain of the power transistor 11, or a fault in which the on-resistance of the power transistor 12 becomes larger than expected, VN1 becomes higher than in the normal state and rises to near VD1p. Since VN1>VN2, the output DOUT1 of the voltage determination circuit 23 becomes a high level.

Since control circuit 19 receives the diagnostic result indicating a failure from the diagnostic circuit 21 (high-level DOUT1), it sets the power transistors 11 and 12 to the off-state and notifies the failure state to an external circuit such as a CPU.

FIG. 6 is based on first embodiment, but may also be based on second embodiment.

Third embodiment can also detect a failure of the pre-driver 20. Pre-driver 20, based on an instruction signal from the control circuit 19, generates a gate signal of the power transistors 11 and 12. Since a higher voltage is required to drive the gates of the power transistors 11 and 12, the pre-driver 20 has a step-up circuit such as a charge pump. Here, it is assumed that there is a failure in the boost circuit, and the gate signal of the power transistor 11 has become a voltage lower than a predetermined voltage. In this instance, since the on-resistance of the power transistor 11 becomes higher, VN1 becomes lower than that in the normal state. On the other hand, the resistors 30 and 31 are not affected by the failure of the pre-driver 20. Therefore, since VN1<VN2, DOUT1 becomes high level. The control circuit 19 is capable of detecting a failure of semiconductor device 10b.

In third embodiment, it is possible to detect the failure of the pre-driver 20 and make the same effects as first and second embodiments with a simpler circuit configuration.

Fourth Embodiment

Figure 7:
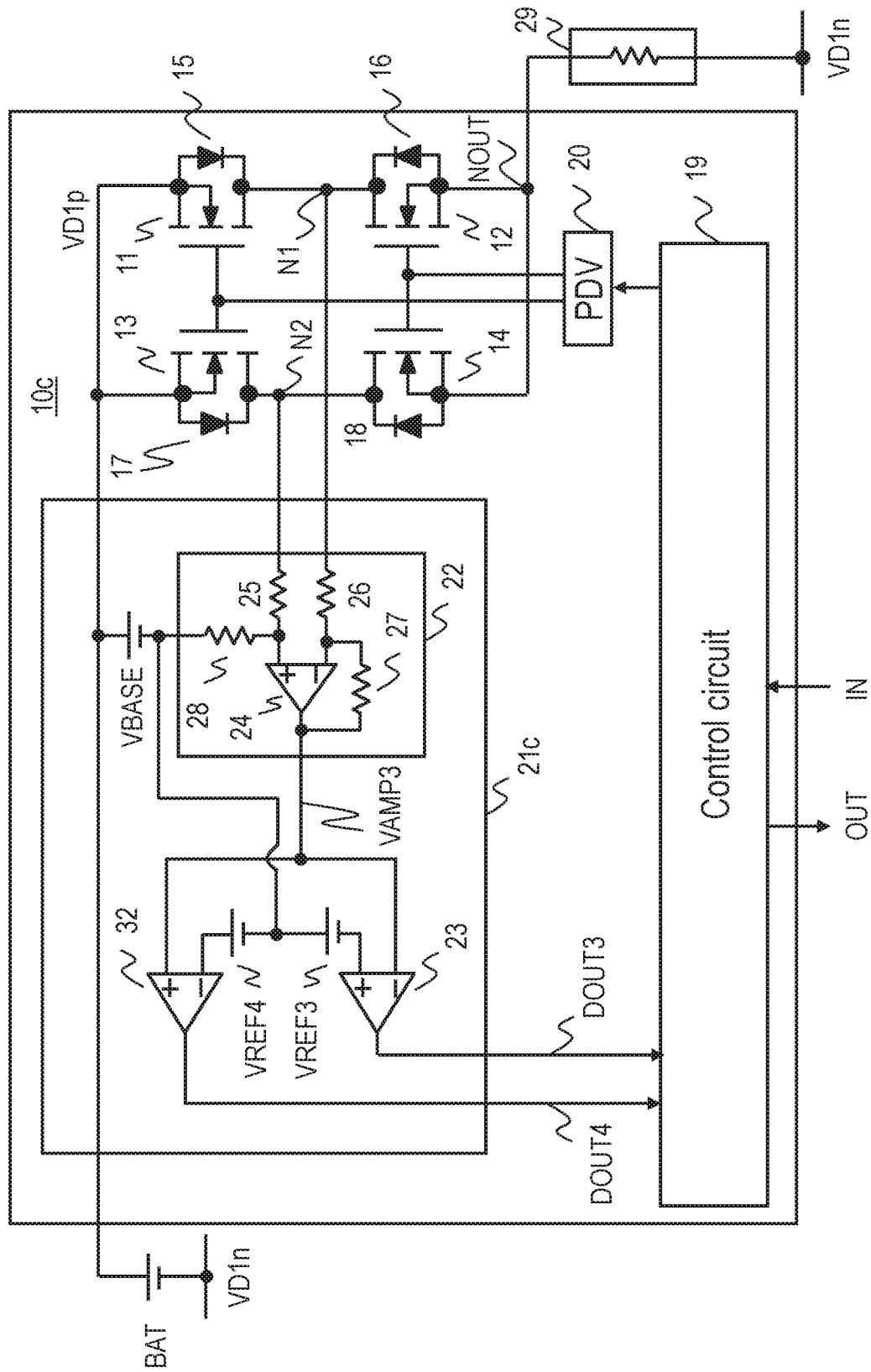
FIG. 7 is a diagram of a semiconductor device according to fourth embodiment.

FIG. 7 is a block diagram showing a configuration of a semiconductor device 10c according to fourth embodiment.

The difference from first embodiment is that the diagnostic circuit 21 is replaced by a diagnostic circuit 21c. Diagnostic circuit (first diagnostic circuit) 21c has a differential amplifier circuit 22, the voltage determination circuit 23, 32, reference voltage circuit (first reference voltage circuit) VBASE, reference voltage circuit (second reference voltage circuit) VREF3, reference voltage circuit (third reference voltage circuit) VREF4. The voltage determination circuit 23, 32 comprise a first voltage determination circuit. Voltage determination circuit 32 is constituted by a comparator (second comparator).

Differential amplifier circuit 22 is the same as the differential amplifier circuit 22 of first embodiment. However, the non-inverting input of the operational amplifier 24 is connected to reference voltage circuit VBASE via a resistor 28. When the output voltage of reference voltage circuit VBASE is VBASE, the output VAMP3 of the differential amplifier circuit 22 is VAMP3=(VN2−VN1)*R2/R1+ (VD1p−VBASE). VAMP3 varies with the difference between VN2 and VN1 on (VD1p−VBASE) basis.

The output-voltages of reference voltage circuit VREF3, VREF4 are VREF3, VREF4 respectively. Voltage determination circuit 23 compares VAMP3 with (VD1p−VBASE−VREF3). Voltage determination circuit 32 compares VAMP3 with (VD1p−VBASE+VREF4).

The operation of semiconductor device 10c is similar to second embodiment. When semiconductor device 10c is normal, since VN1 and VN2 are substantially the same voltage, VAMP3 is 0 on (VD1p−VBASE) basis. In this case, the voltage determination circuit 23 outputs a low-level DOUT3. Voltage determining circuit 32 also outputs a low-level DOUT4.

The control circuit 19, since both of DOUT3, DOUT4 is low level, determines that semiconductor device 10c is normal, and continues supplying power to the load 29.

It will now be described when a failure occurs in semiconductor device 10c. If a first failure in semiconductor device 10c (a short-circuit failure between the source and drain of the power transistor 11, or a failure in which the on-resistance of the power transistor 12 becomes larger than expected) occurs, VN1>VN2. VAMP3 becomes negative on (VD1p−VBASE) basis. Here, (VD1p−VBASE−VREF3) is set to be higher than VAMP3 when the first failure occurs. In this case, the voltage determination circuit 23 outputs a high-level DOUT3. Voltage determination circuit 32, when VN1>VN2, outputs a low-level DOUT4.

Since control circuit 19 receives the high-level DOUT3 and low-level DOUT4, it is determined that the first failure has occurred in semiconductor device 10c. In this case, the control circuit 19 stops the power supply to the load 29, and notifies the external circuit such as the CPU of the failure state.

Next, a second failure in semiconductor device 10c (a short-circuit failure between the source and drain of the power transistor 12, or a failure in which the on-resistance of the power transistor 11 becomes larger than expected) will be described. In this instance, since VN2>VN1, the voltage VAMP3 becomes (saturates) 0 on (VD1p−VBASE) basis. Here, (VD1p−VBASE+VREF4) is set to be lower than VAMP3 when the second failure occurs. In this case, the voltage determination circuit 32 outputs a high-level DOUT4. The voltage determination circuit 23 outputs a low-level DOUT3.

Control circuit 19, since it has received DOUT3 and the high-level DOUT4 of the low level, it is determined that the second failure has occurred in semiconductor device 10c. In this case, the control circuit 19 stops the power supply to the load 29, and notifies the external circuit such as the CPU of the failure state.

In semiconductor device 10c according to fourth embodiment, the same effects as those of second embodiment can be realized with a smaller circuit-scale.

Fifth Embodiment

Figure 8:
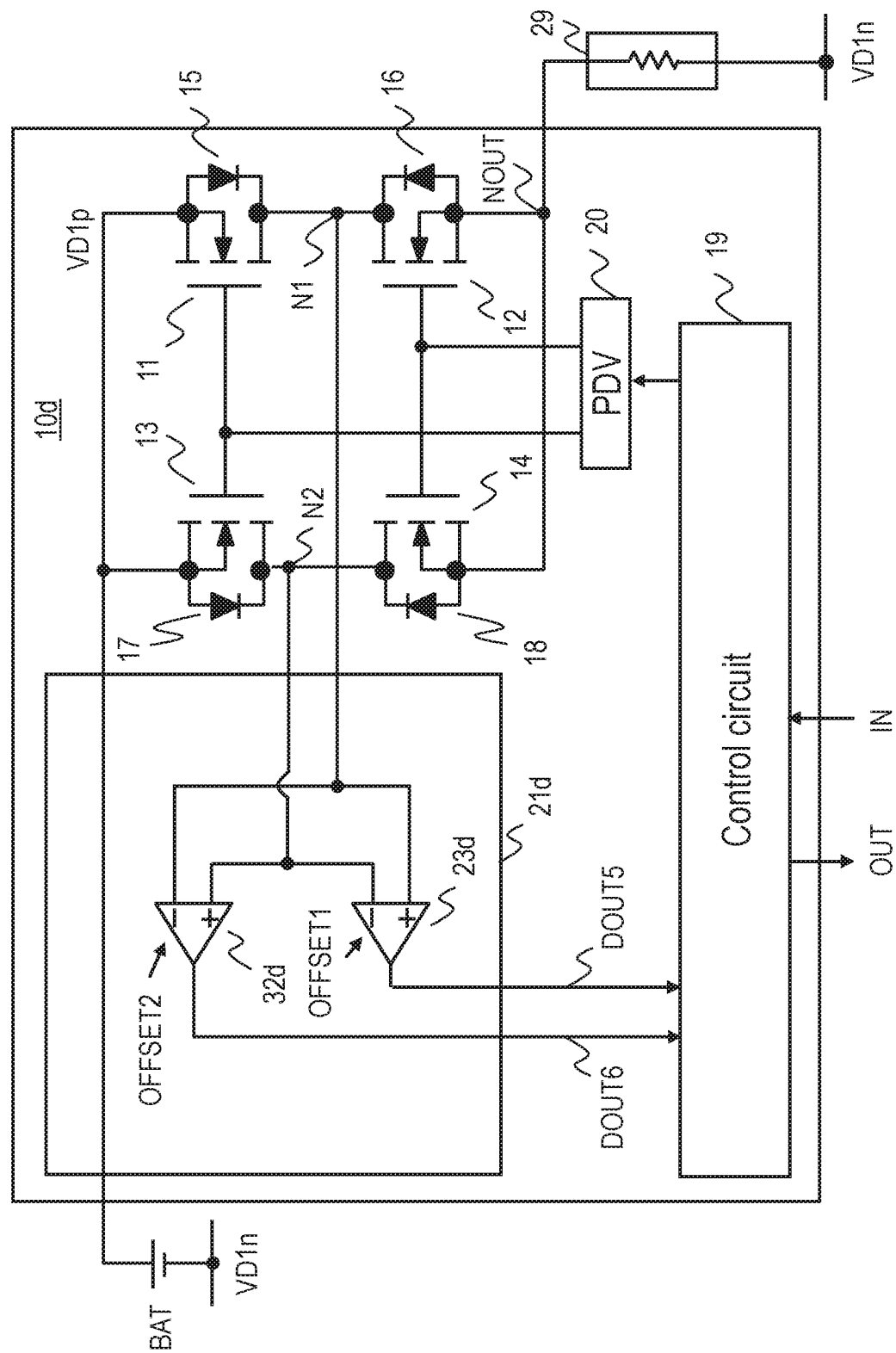
FIG. 8 is a diagram of a semiconductor device according to fifth embodiment.

FIG. 8 is a block diagram showing a configuration of a semiconductor device 10d according to fifth embodiment.

The difference from fourth embodiment is the diagnostic circuit 21d. In the diagnostic circuit (first diagnostic circuit) 21d, the differential amplifier circuit 22 is deleted, minus (−) terminals of the voltage determination circuit 23d, 32d have offsets. Reference voltage circuits VASE, VREF3, VREF4 are also deleted.

Voltage determination circuit (first voltage determination circuit) 23d compares VN2 with VN1. When the offset voltage of the voltage determination circuit 23d is OFFSET1, the voltage determination circuit 23d compares VN1 with (VN2+OFFSET1). Similarly, the voltage determination circuit 32d (second voltage determination circuit) compares (VN1+OFFSET2) with VN2.

If semiconductor device 10d is normal, since VN1 and VN2 are substantially the same voltage, the voltage determination circuit 23d, 32d output low-level DOUT5, DOUT6.

If a first failure in semiconductor device 10d (a short-circuit failure between the source and drain of the power transistor 11, or a failure in which the on-resistance of the power transistor 12 becomes larger than expected) occurs, VN1>VN2. Here, OFFSET1, when the first failure occurs, is set so that VN1>(VN2+OFFSET1). In this case, the voltage determination circuit 23d outputs a high-level DOUT5. Further, the voltage determination circuit 32d outputs a low-level DOUT6.

Next, a second failure in semiconductor device 10d (a short-circuit failure between the source and drain of the power transistor 12, or a failure in which the on-resistance of the power transistor 11 becomes larger than expected) occurs, VN1>VN2. Here, OFFSET2, when the second failure occurs, is set so that VN2>(VN1+OFFSET2). In this case, the voltage determination circuit 32d outputs a high-level DOUT6. Further, the voltage determination circuit 23d outputs a low-level DOUT5.

Similar to fourth embodiment, the control circuit 19 determines the failure status of semiconductor device 10d in accordance with the output levels of DOUT5 and 6.

Semiconductor device 10d according to fifth embodiment can realize the same effects as those of fourth embodiment with a smaller circuit-scale.

Sixth Embodiment

Figure 9:
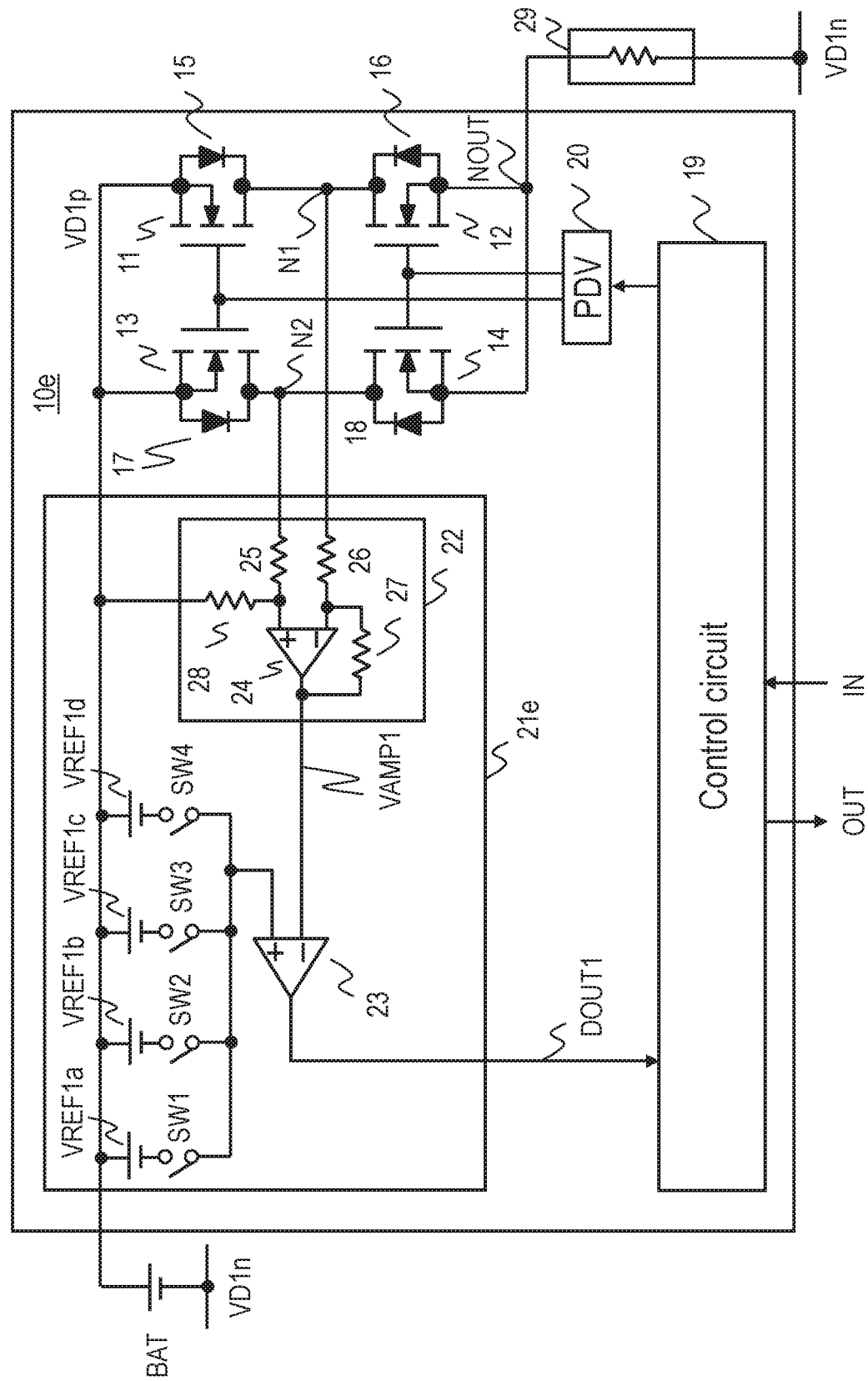
FIG. 9 is a diagram of a semiconductor device according to Embodiment 6.

FIG. 9 is a diagram showing a configuration of a semiconductor device 10e according to Sixth embodiment.

The difference from first embodiment is that the diagnostic circuit 21 is replaced by a diagnostic circuit 21e. Diagnostic circuit (first diagnostic circuit) 21e replaces reference voltage circuit VREF1 of FIG. 1 with a plurality of reference voltage circuits VREF1a to VREF1d and a plurality of switches SW1 to SW4.

As described in first embodiment, reference voltage circuit VREF1 must be set considering the failure of the power transistors 11, 12. In sixth embodiment, by switching the switches SW1~SW4, it is possible to arbitrarily set the comparative voltage of the voltage determination circuit 23. Incidentally, the control circuit 19 may set the switches SW1 to SW4 by an instruction from an external circuit such as a CPU, or the external circuit may set the switches SW1 to SW4 directly.

In semiconductor device 10d according to sixth embodiment, the failure detecting system can be improved. Note that, although sixth embodiment has been described based on first embodiment, it is applicable to other embodiments.

It should be noted that the present invention is not limited to the above-mentioned embodiments, and various modifications can be made without departing from the gist thereof.

What is claimed is:

1. A semiconductor device comprising:
    a bridge circuit that includes first to fourth elements;
    a first diagnostic circuit that detects a potential difference between two intermediate nodes of the bridge circuit; and
    a control circuit that detects a failure of the first element or the second element based on an output of the first diagnostic circuit,
    wherein the first and second elements are first and second power transistors connected in series,
    wherein the first power transistor receives power supply from a battery and is a reverse connection protection transistor of the battery,
    wherein the first diagnostic circuit has a first voltage determination circuit that determines whether the potential difference between the two intermediate nodes is equal to or greater than a predetermined value,
    wherein the third and fourth elements are first and second sense transistors connected in series, and
    wherein the first voltage determination circuit determines a potential difference between a first intermediate node to which the first and second power transistors are connected and a second intermediate node to which the first and second sense transistors are connected.

2. The semiconductor device according to claim 1,
    wherein the first diagnostic circuit further includes a first differential amplifier circuit that amplifies the potential difference between the first and second intermediate nodes, and
    wherein the first voltage determination circuit determines whether the amplified potential difference is equal to or greater than a predetermined value.

3. The semiconductor device according to claim 2, a current sense ratio between the first power transistor and the first sense transistor is substantially the same as a current sense ratio between the second power transistor and the second sense transistor.

4. The semiconductor device according to claim 2,
    wherein the first differential amplifier circuit comprises:
        a first operational amplifier,
        a first resistor coupled between a non-inverting input of the first operational amplifier and a power line from the battery, and
        a second resistor coupled between an inverting input of the first operational amplifier and an output of the first operational amplifier, and
    wherein the inverting input of the first operational amplifier is coupled to the first intermediate node and the non-inverting input of the first operational amplifier is coupled to the second intermediate node.

5. The semiconductor device according to claim 4,
    wherein the first voltage determination circuit comprises:
        a first comparator,
        a first reference voltage circuit, and
    wherein an inverting input of the first comparator is coupled to an output of the first differential amplifier circuit and a voltage stepped down from a supplied voltage from the battery by the first reference voltage circuit is supplied to a non-inverting input of the first comparator.

6. The semiconductor device according to claim 1, further comprising:
    a second diagnostic circuit,
    wherein the first diagnostic circuit determines whether a voltage of the first intermediate node is higher than a voltage of the second intermediate node or not, and
    wherein the second diagnostic circuit determines whether the voltage of the second intermediate node is higher than the voltage of the first intermediate node or not.

7. The semiconductor device according to claim 6,
    wherein the first diagnostic circuit has a first differential amplifier circuit and a first voltage determination circuit,
    wherein the second diagnostic circuit has a second differential amplifier circuit and a second voltage determination circuit,
    wherein the first differential amplifier circuit has a first operational amplifier, a first resistor coupled between a non-inverting input of the first operational amplifier and a power line from the battery and a second resistor coupled between an inverting input of the first operational amplifier and the output of the first operational amplifier,
    wherein the inverting input of the first operational amplifier is coupled to the first intermediate node and the non-inverting input of the first operational amplifier is coupled to the second intermediate node,
    wherein the second differential amplifier circuit has a second operational amplifier, a third resistor coupled between a non-inverting input of the second operational amplifier and the power line from the battery and a fourth resistor coupled between an inverting of the second operational amplifier input and the output of the second operational amplifier,
    wherein the inverting input of the second operational amplifier is coupled to the second intermediate node and the non-inverting input of the second operational amplifier is coupled to the first intermediate node,
    wherein the first voltage determination circuit has a first comparator and a first reference voltage circuit,
    wherein an inverting input of the first comparator is coupled to an output of the first differential amplifier circuit and a voltage stepped down from a supplied voltage from the battery by the first reference voltage circuit is supplied to a non-inverting input of the first comparator,
    wherein the second voltage determination circuit has a second comparator and a second reference voltage circuit, and
    wherein an inverting input of the second comparator is coupled to an output of the second differential amplifier circuit and a voltage stepped down from the supplied voltage from the battery by the second reference voltage circuit is supplied to a non-inverting input of the second comparator.

8. A semiconductor device comprising:
    a bridge circuit that includes first to fourth elements;
    a first diagnostic circuit that detects a potential difference between two intermediate nodes of the bridge circuit; and a control circuit that detects a failure of the first element or the second element based on an output of the first diagnostic circuit, wherein the first and second elements are first and second power transistors connected in series, wherein the first power transistor receives power supply from a battery and is a reverse connection protection transistor of the battery, wherein the first diagnostic circuit has a first voltage determination circuit that determines whether the potential difference between the two intermediate nodes is equal to or greater than a predetermined value, wherein the third and fourth elements are first and second resistors connected in series, and wherein the first voltage determination circuit determines a potential difference between a first intermediate node to which the first and second power transistors are coupled and a second intermediate node to which the first and second resistors are coupled.

9. The semiconductor device according to claim 8, wherein the first diagnostic circuit further includes a first differential amplifier circuit that amplifies the potential difference between the first and second intermediate nodes, and wherein the first voltage determination circuit determines whether the amplified potential difference is equal to or greater than a predetermined value or not.

10. The semiconductor device according to claim 9, wherein a ratio of on-resistance values of the first and second power transistors is substantially the same as a ratio of resistance values of the first and second resistors.

11. The semiconductor device according to claim 10, wherein the first differential amplifier circuit comprises:
a first operational amplifier,
a first resistor coupled between a non-inverting input of the first operational amplifier and a power line from the battery, and
a second resistor coupled between an inverting input of the first operational amplifier and an output of the first operational amplifier, and
wherein the inverting input of the first operational amplifier is coupled to the first intermediate node and the non-inverting input of the first operational amplifier is coupled to the second intermediate node.

12. The semiconductor device according to claim 11, wherein the first voltage determination circuit comprises:
a first comparator, and
a first reference voltage circuit, and
wherein an inverting input of the first comparator is coupled to an output of the first differential amplifier circuit and a voltage stepped down from a supplied voltage from the battery by the first reference voltage circuit is supplied to a non-inverting input of the first comparator.

13. The semiconductor device according to claim 4, further comprising:
a first reference voltage circuit,
wherein a first voltage stepped down from a supplied voltage from the battery by the first reference voltage circuit is supplied to the non-inverting input of the first operational amplifier through the first resistor,
wherein the first voltage determination circuit has first and second comparators and second and third reference voltage circuits,
wherein an inverting input of the first comparator and a non-inverting input of the second comparator are coupled to an output of the first differential amplifier,
wherein a voltage stepped down from the first voltage by the second reference voltage circuit is supplied to a non-inverting input of the first comparator, and
wherein a voltage boosted from the first voltage by the third reference voltage circuit is supplied to an inverting input of the second comparator.

14. The semiconductor device according to claim 1, further comprising:
a second voltage determination circuit,
wherein a non-inverting input of the first voltage determination circuit and an inverting input of the second voltage determination circuit are coupled to the first intermediate node,
wherein an inverting input of the first voltage determination circuit and a non-inverting input of the second voltage determination circuit are coupled to the second intermediate node, and
wherein an offset voltage is set to the inverting input of each of the first and second voltage determination circuits.

15. The semiconductor device according to claim 4, wherein the first voltage determination circuit has a first comparator, a plurality of reference voltage circuits and a plurality of switches each of which is coupled to each of reference voltage circuits respectively,
wherein an inverting input of the first comparator is coupled to an output of the first differential amplifier circuit, and
wherein a voltage stepped down from a supplied voltage from the battery by one of the reference voltage circuits selected by the switches is supplied to a non-inverting input of the first comparator.

* * * * *